(12) United States Patent
Chien et al.

(10) Patent No.: US 9,391,299 B2
(45) Date of Patent: Jul. 12, 2016

(54) LIGHT-EXTRACTION ELEMENT INCLUDING RASPBERRY-LIKE PARTICLES

(71) Applicant: Industrial Technology Research Institute, Hsinchu (TW)

(72) Inventors: Pei-Chi Chien, Zhudong Township, Hsinchu County (TW); Ping-Chen Chen, Taipei (TW)

(73) Assignee: INDUSTRIAL TECHNOLOGY RESEARCH INSTITUTE, Hsinchu (TW)

( * ) Notice: Subject to any disclaimer, the term of this patent is extended or adjusted under 35 U.S.C. 154(b) by 49 days.

(21) Appl. No.: 14/100,474

(22) Filed: Dec. 9, 2013

(65) Prior Publication Data

US 2014/0332773 A1 Nov. 13, 2014

(30) Foreign Application Priority Data

May 8, 2013 (TW) .............................. 102116330 A (51) Int. Cl.
*H01L 29/08* (2006.01)
*H01L 51/52* (2006.01)

(52) U.S. Cl.
CPC ....... *H01L 51/5268* (2013.01); *Y10T 428/2848* (2015.01)

(58) Field of Classification Search
CPC .......................... H01L 51/5268; H01L 51/5275
USPC ......................................................... 257/40
See application file for complete search history.

(56) References Cited

U.S. PATENT DOCUMENTS

| 7,446,462 B2 | 11/2008 | Lim et al. |
| 8,179,034 B2 | 5/2012 | Potts et al. |
| 8,298,032 B2 | 10/2012 | Potts et al. |

(Continued)

FOREIGN PATENT DOCUMENTS

| CN | 101208811 A | 6/2008 |
| JP | 2011248104 A | 12/2011 |

(Continued)

OTHER PUBLICATIONS

Liu, Chih-Che et al., Miorocavity top-emitting organic light-emitting devices integrated with diffusers for simultaneous enhancement of efficiencies and viewing characteristics, American Institute of Physics:Applied Physics Letters, 2009, pp. 103302-1-103302-3.

(Continued)

*Primary Examiner* — Matthew Gordon
(74) *Attorney, Agent, or Firm* — Muncy, Geissler, Olds & Lowe, P.C.

(57) ABSTRACT

The invention provides a light-extraction element, comprising a light-diffusion layer which including a resin; and a plurality of raspberry-like particles uniformly dispersed in the resin, wherein the raspberry-like particles feature a surface with a plurality of round bumps, and the plurality of raspberry-like particles are composed of a material having a single reflective index. The invention also provides a light-emitting device, including a pair of electrodes composed of an anode and a cathode; an organic light-emitting unit disposed between the pair of electrodes, wherein the organic light-emitting unit includes a light-emitting layer; and a light-extraction element which is disposed on a light-emitting surface of the light-emitting device.

18 Claims, 8 Drawing Sheets

(56) References Cited

U.S. PATENT DOCUMENTS

| | | | |
|---|---|---|---|
| 2005/0093008 A1* | 5/2005 | Suehiro et al. | 257/98 |
| 2006/0290272 A1 | 12/2006 | Haenichen | |
| 2009/0256166 A1* | 10/2009 | Koike et al. | 257/98 |
| 2009/0317044 A1* | 12/2009 | Buretea et al. | 385/132 |
| 2010/0010112 A1* | 1/2010 | Prenzel et al. | 522/86 |
| 2012/0098421 A1 | 4/2012 | Thompson | |
| 2012/0153320 A1* | 6/2012 | Gaertner et al. | 257/89 |

FOREIGN PATENT DOCUMENTS

| | | | |
|---|---|---|---|
| TW | 200913767 A | | 3/2009 |
| TW | 201301612 A | | 1/2013 |
| TW | 201310742 A | | 3/2013 |
| WO | WO-2011148823 A | | 12/2011 |
| WO | WO-2012039319 A1 | | 3/2012 |

OTHER PUBLICATIONS

Yang, Chih-Jen et al., Microcavity top-emitting organic light-emitting devices integrated with microlens arrays: Simultaneous enhancement of quantum efficiency, cd/A efficiency, color performances, and image resolution, American Institue of Physics: Applied Physics Letters, 2007, pp. 253508-1-253508-3.

EOM, Sang-Hyun et al., Close-packed hemispherical microlens arrays for light extraction enhancement in organic light-enitting devices, Elsevier: Organic Electronics, 2011, pp. 472-476.

Peng, Huajun et al., Coupling Efficiency Enhancement in Organic Light-Emitting Devices Using Microlens Array- Theory and Experiment, Journal of Display Technology, Dec. 2005, pp. 278-282.

Shiang, J.J. et al., Experimental demostration of increased organic light emitting device output via volumetic light scattering, American Institute of Phyics: Journal of Applied Physics, Mar. 2004, pp. 2889-2895.

Li, Feng et al., Enhanced light extraction for organic light-emitting devices by using microcontact printed silica colloidal crystals, Elsevier: Organic Electronics, 2007, pp. 635-639.

Huang, Wen-Kuei et al., Enhanced Light Out-Coupling Efficiency of Organic Light-Emitting Diodes with Self-Organized Microlens Arrays, Japanese Journal of Applied Science, 2006, pp. L1100-L1102.

Taiwanese Office Action dated Jul. 7, 2015, as issued in corresponding Taiwan Patent Application No. 102116330 (9 pages).

\* cited by examiner

LIGHT-EXTRACTION ELEMENT INCLUDING RASPBERRY-LIKE PARTICLES

CROSS REFERENCE TO RELATED APPLICATIONS

This application is based upon and claims the benefit of priority from the prior Taiwan Patent Application No. 102116330, filed on May 8, 2013, the entire contents of which are incorporated herein by reference.

TECHNICAL FIELD

The technical field relates to a light extraction element and light-emitting device thereof.

BACKGROUND

An organic light-emitting diode (OLED) device is generally composed of glass substrates, conductive electrodes made of indium tin oxide (ITO), and an organic light-emitting layer. No matter whether the OLED device is a "top-emitting type" or "bottom-emitting type", the large difference between the refractive indices of the materials used in the device results in reflection at the interface. This reflection in OLEDs may cause a low efficiency of light extraction. According to studies, in general OLEDs, almost a 70-80% loss of light that cannot be guided outside the device results from the reflection at the interface. The difference of the refractive indices of the materials used in OLEDs may be improved by selecting the materials of OLEDs or changing the structure thereof to increase light extraction efficiency. However, the alteration of materials or structures is accompanied by changes in the manufacturing process which brings a greater challenge to the development of OLEDs.

An external light extraction diffusion layer is typically disposed on the surface of OLEDs to achieve diffusion effects by light scattering. The diffusion layer is generally composed of solid organic particles or inorganic particles with a high refractive index. However, the effect of light extraction is unsatisfactory.

In previous studies, a diffusion layer comprising a microlens or solid inorganic particles have been used as a light-extraction film, or the diffusion layer can be composed of particles, ultrafine particles, and resin. Since the particles are surrounded by a high concentration of ultrafine particles with a large difference of refractive indexes, a good light-extraction efficiency can be obtained. However, the effect of reducing the color shift is limited. The color shift can be reduced by coating a diffusion layer (a particle with a high refractive index, the particle size being about 0.2-1 µm) and a light condenser layer (the refractive index of the particle being about 1.4-1.6, and the particle size being about 3-10 µm) sequentially on the transparent resin substrate. Although the combination of the two coatings as a light-extraction layer can reduce the color shift, the process is more complicated. In addition, a diffusion layer that includes scattering particles of a special shape can provide improved brightness and anti-adhesive, antifouling, and weather-proofing properties. However, such a diffusion layer needs materials of two different refractive indices.

Therefore, improvements in the light-extraction efficiency of the light-emitting element of OLEDs are required.

SUMMARY

According to an embodiment, the disclosure provides a light-extraction element, including a light-diffusion layer, which includes: a resin, and a plurality of raspberry-like particles uniformly dispersed in the resin, wherein the raspberry-like particles feature a surface with a plurality of round bumps, and the plurality of raspberry-like particles are composed of a material having a single reflective index.

In accordance with another embodiment, the disclosure also provides a light-emitting device, including a pair of electrodes composed of an anode and a cathode; an organic light-emitting unit disposed between the pair of electrodes, wherein the organic light-emitting unit includes a light-emitting layer; and a light-extraction element disposed on a light-extraction surface of the light-emitting device.

A detailed description is given in the following embodiments with reference to the accompanying drawings.

BRIEF DESCRIPTION OF DRAWINGS

The disclosure can be more fully understood by reading the subsequent detailed description and examples with references made to the accompanying drawings, wherein.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

A light-extraction element suitable for use in a light-emitting device is provided. Scattering occurs due to the collision of lights when they enter the light-diffusion layer, which results in a change of the angle of light propagation, thereby enhancing the light-extraction efficiency of the light source. The present disclosure enhances the light-extraction efficiency of the light-emitting device, for example, an organic light-emitting diode (OLED), in a simple and cost-effective manner.

The light-diffusion layer of the disclosure is made of a resin and diffusion materials, including a plurality of self-made raspberry-like particles. Scattering can be caused not only by the difference of refractive indices between the resin and the raspberry-like particles, but also by the special surface contour of the raspberry-like particles. The raspberry-like particles feature a surface with more than 10, such as 10-50, round bumps. The resulting scattering can not only significantly enhance the light-extraction efficiency, but also reduce or even eliminate the color shift of OLEDs at a large viewing angle.

Figure 1:
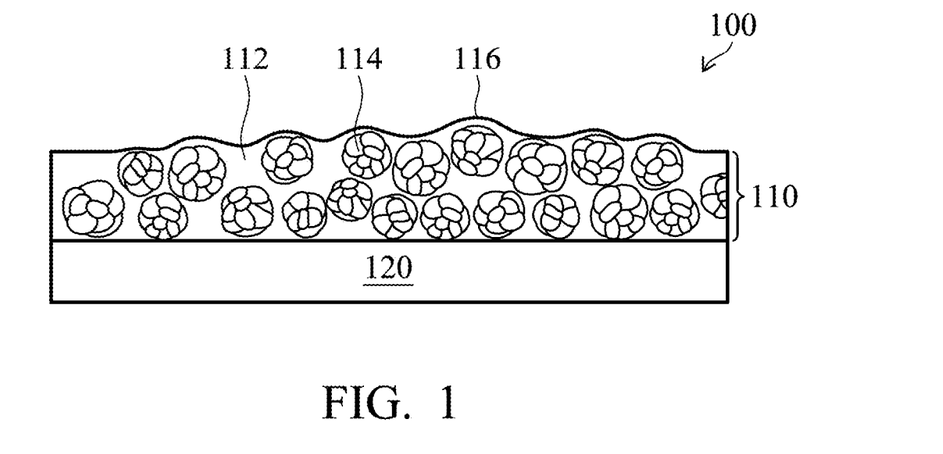
FIG. 1 is a schematic view of a light-extraction element according to an embodiment of the disclosure.

FIG. 1 is a schematic view of a light-extraction element 100 according to an embodiment of the disclosure. The light-extraction element 100 includes a light-diffusion layer 110 which includes a resin 112 and a plurality of raspberry-like particles 114. The raspberry-like particles feature a surface with a plurality of round bumps and are uniformly dispersed in the resin 112. The raspberry-like particles 114 are composed of a material having a single reflective index. The raspberry-like particles 114 may have a particle size distribution between about 0.01 μm and about 50 μm, for example, between about 0.3 μm and about 40 μm, or between about 0.4 μm and about 8 μm. It should be noted that the raspberry-like particles 114 per se are primary particles instead of secondary particles formed from the aggregation of primary particles. Therefore, the raspberry-like particles 114 have a homogeneous cross-section, and the homogeneous cross-section has no interface. Moreover, the light-diffusion layer may further include an aggregate form of the plurality of raspberry-like particles. The raspberry-like particles 114 may be formed of art organic material, including polystyrene, polymethyl methacrylate, polydivinylbenzene, polyethylene glycol dimethacrylate, polytrimethyloipropane trimethacrylate, or copolymers thereof, polycarbonate, polyethylene, or a combination thereof. The raspberry-like particles 114 may also be formed of an inorganic material, including silicone resin, calcium carbonate, silicon dioxide, titanium dioxide, or a combination thereof.

The raspberry-like particles may be formed by dispersion polymerization, In the dispersion polymerization, ethanol and toluene may be used as solvents, and monomers having two or more functional groups such as divinylbenzene, ethylene glycol dimethacrylate, trimethylolpropane trimethacrylate may be used. Alternatively, monomers having one functional group such as styrene, methyl methacrylate may be used together with a monomer having two or more functional groups. Dispersants such as polyvinyl pyrrolidone, poly vinyl alcohol, Tween-20, Tween-80, span-20, span-80, or the like may be used. Different particle size distributions may be obtained according to different ratios of ethanol to toluene. Uniformly dispersed and stable raspberry-like single particles may be formed under a proper ratio of ethanol to toluene. For example, the percentage of ethanol may be more than 50%, or 90%, based on the total weight of the solvents. The dispersion stability of the raspberry-like particles may become worse and the uniformly dispersed single particle may aggregate as the ratio of toluene becomes higher in the solvent. When the ratio of toluene reaches 50%, a lump precipitate may be formed instead of a uniform dispersion composed of stable raspberry-like single particles. In other embodiments, a single solvent or a combination of two or more solvents, such as toluene, methanol, ethanol, propanol, other alcohols, may be used depending on the monomers employed.

The resin 112 may include a thermoplastic resin, a thermo-curable resin, a light-curable resin, or combinations thereof. The weight ratio of the raspberry-like particles 114 to the resin 112 is between about 1/10 and about 10/1, or between about 1/6 and about 6/1. In one embodiment, the resin 112 conformally covers the raspberry-like particles 114 and forms an irregular top surface 116 to enhance the light-extraction efficiency. In another embodiment, the resin 112 may also form a flat top surface 116.

Referring to FIG. 1, the light-diffusion layer 110 may further include an additive to adjust the degree of uniformity and dispersion. The additive may include at least one non-ionic dispersants such as Tween-20, Tween-60, Tween-800, at least one surfactants such as fluorinated surfactants such as FC4432, FC430, or a combination of dispersant and surfactant. The additive is present in the amount of about 0.005 wt % to about 15 wt %, based on the total weight of the raspberry-like particles 114. An insufficient amount of the additive may cause poor uniformity of coating. On the other hand, an excess amount of the additive may cause deterioration of the optical properties, such as poor light-extraction efficiency, yellowish color, or poor appearance.

Referring to FIG. 1, the light-extraction element 100 may further include a substrate 120, such as polyethylene terephthalate (PET), polyethylene naphthalate (PEN), and so on. The light-diffusion layer 110 is disposed on the substrate 120. The light-extraction element 100 may further include an adhesive layer 130 which is disposed on an opposite surface of the substrate 120 relative to the light-diffusion layer 110 to adhere the light-extraction element 100 on the light-emitting surface 200a of the OLED device. The adhesive layer 130 may include, for example, a transparent glue containing polypropylene, a thermo-curable glue, or an ultraviolet light-curable glue.

Figure 2:
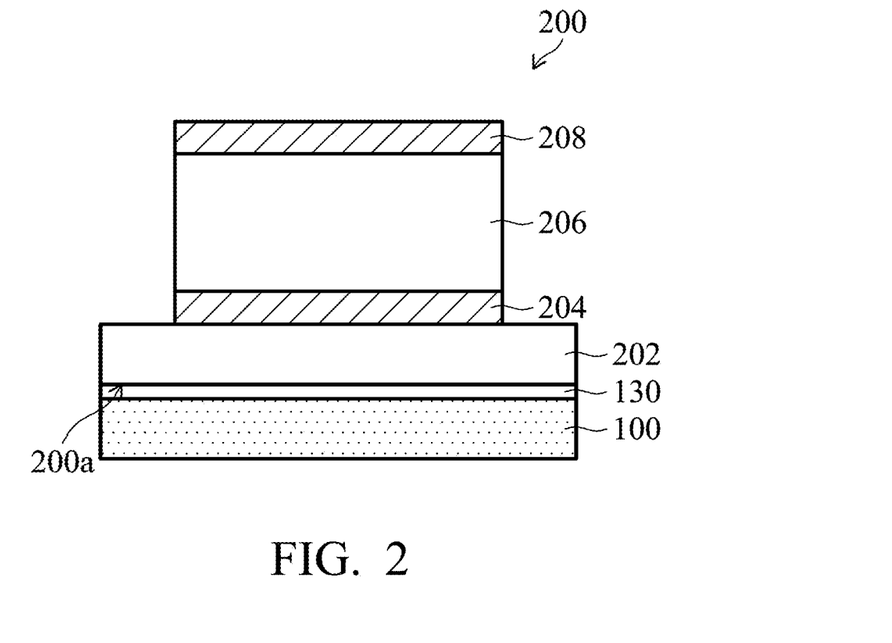
FIG. 2 is a cross-sectional view of a light-emitting device including a light-extraction element according to an embodiment of the disclosure.

FIG. 2 is a cross-sectional view of a light-emitting device 200 according to an embodiment of the disclosure. The light-emitting device 200 includes a substrate 202 on which a lower electrode 204, an organic light-emitting unit 206, and an upper electrode 208 are sequentially stacked. The above mentioned light-extraction element 100 is disposed on the light-emitting surface 200a of the light-emitting device 200 by the adhesive layer 130. Although the light-emitting device 200 as shown in FIG. 2 is a bottom-emitting type, it may be a top-emitting type in other embodiments, wherein a substrate 202, an adhesive layer 130, and a light-extraction element 100 may be sequentially formed on the upper electrode 208. Alternatively, the light-emitting device 200 may also be a double-emitting type, wherein a substrate 202, an adhesive layer 130, and a light-extraction element 100 may be sequentially formed on both of the two light-emitting surfaces 200a of the light-emitting device 200.

The substrate 202 may be a transparent substrate such as a glass substrate, plastic substrate, or semiconductor substrate. The material of the lower electrode 204 and the upper electrode 208 may be, for example, Li, Mg, Ca, Al, Ag, In, Au, W, Ni, Pt, Cu, indium tin oxide (ITO), indium zinc oxide (IZO), zinc aluminum oxide (AZO), ZnO, or combinations thereof. Moreover, at least one of the lower electrode 204 and the upper electrode 208 is optically transparent. The organic light-emitting unit 206 is disposed between the pair of electrodes, and the organic light-emitting unit 206 includes at least one light-emitting layer. The organic light-emitting unit 206 may further include a hole injection layer, a hole transport layer, an electron transport layer, an electron injection layer, or other layers well known in the art. The configuration of the above layers is well known by those skilled in the art, and is not described herein for simplicity.

Without changing the process of OLEDs, the embodiments of the disclosure reduce the reflectivity of the interface by adding a structural layer on the surface of OLEDs to enhance the light-extraction efficiency. In some embodiments, the light-extraction efficiency is improved by more than 11% and the change of chromaticity is reduced by more than 75%, or even 85% by using the raspberry-like particles as compared to the round particles as scattering particles.

Preparative Examples 1-5

Raspberry-like particles having a surface with a plurality of round bumps were prepared by using a dispersion polymerization. Divinylbenzene as a monomer, polyvinyl pyrrolidone as a dispersant, and azobisisobutyronitrile (AIBN) as an initiator were reacted at 70° C. for 10 hours in a solvent system containing ethanol/toluene in a weight ratio of 9/1, 8/2, 7/3, 5/5, and 1/0, respectively. The weight ratio of divinylbenzene, polyvinyl pyrrolidon, and azobisisobutyronitrile (AIBN) was 1:0.2:0.02. The weight ratio of divinylbenzen and the total solvent was 1:9. The results are shown in Table 1.

TABLE 1

| Preparative Examples | Solvent ratio | Results |
|---|---|---|
| Preparative Example 1 | ethanol/toluene = 9/1 | Stable dispersion of particles Particle size distribution: 0.4-8 μm |
| Preparative Example 2 | ethanol/toluene = 8/2 | Stable dispersion of particles Particles partially aggregated Particle size distribution: 0.3-40 μm |
| Preparative Example 3 | ethanol/toluene = 7/3 | Stable dispersion of particles Particles partially aggregated Particle size distribution: 0.3-40 μm |
| Preparative Example 4 | ethanol/toluene = 5/5 | Lump precipitate Non-dispersible |
| Preparative Example 5 | ethanol/toluene = 1/0 | Stable dispersion of particles Particle size distribution: 0.4-3 μm |

Figure 3A:
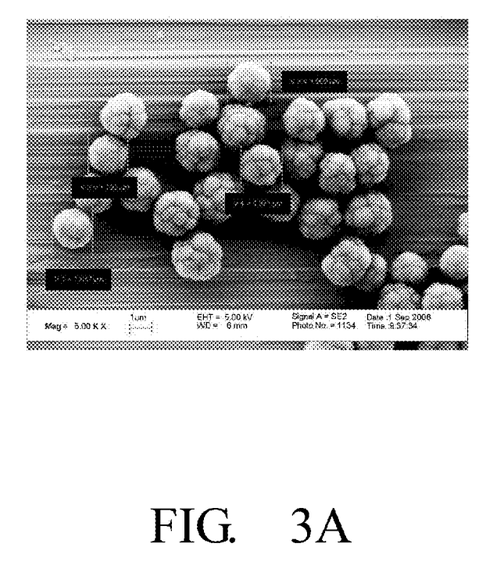
FIG. 3A is a SEM picture of the raspberry-like particles according to Preparative Example 1.
Figure 3B:
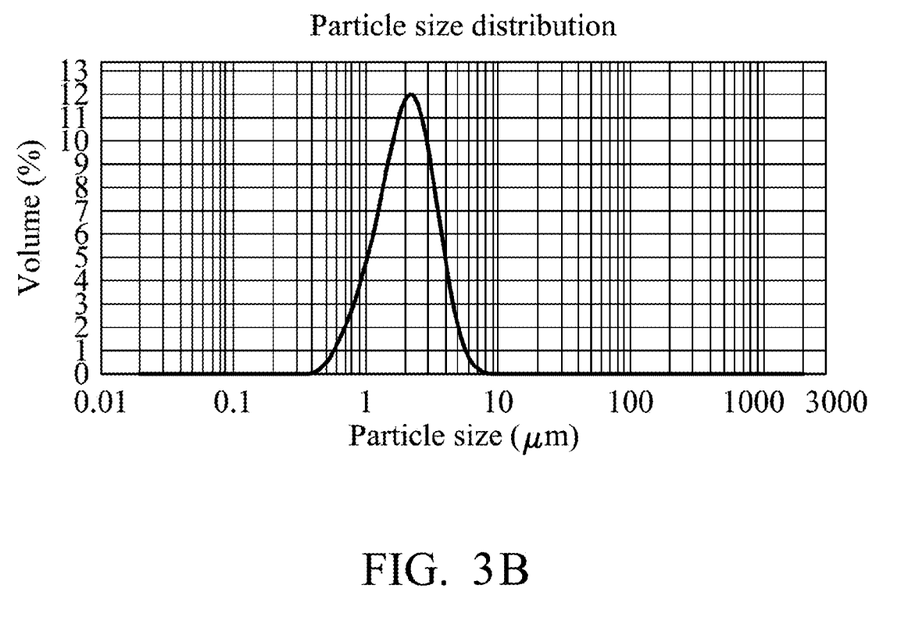
FIG. 3B shows a particle size distribution of the raspberry-like particles according to Preparative Example 1.
Figure 3C:
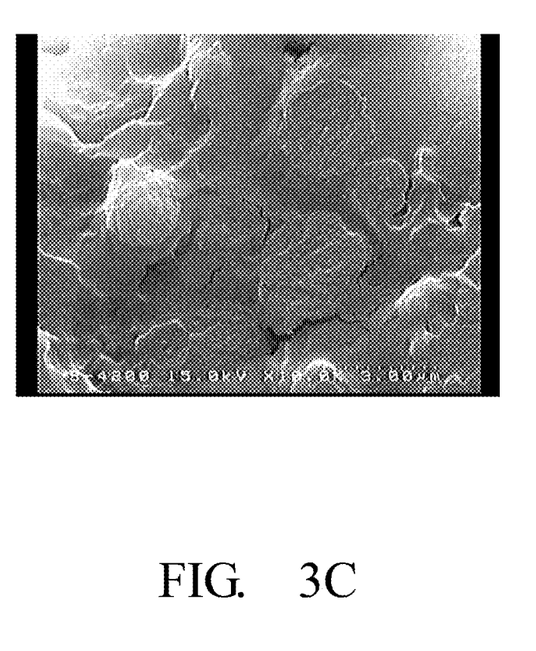
FIG. 3C is a SEM picture cross-sectional view of the raspberry-like particles according to Preparative Example 1.
Figure 4A:
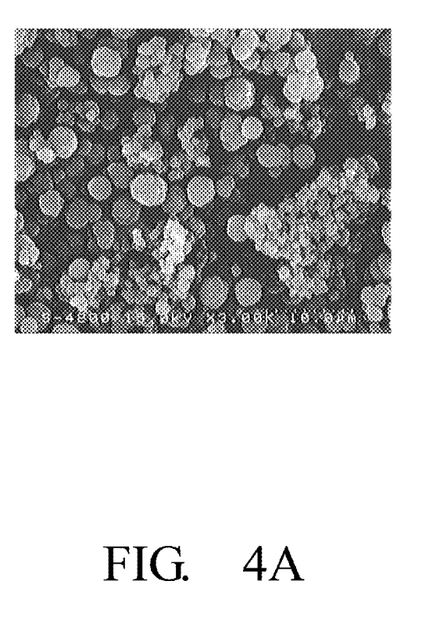
FIG. 4A is a SEM picture of an aggregate form of the raspberry-like particles according to Preparative Example 1.
Figure 4B:
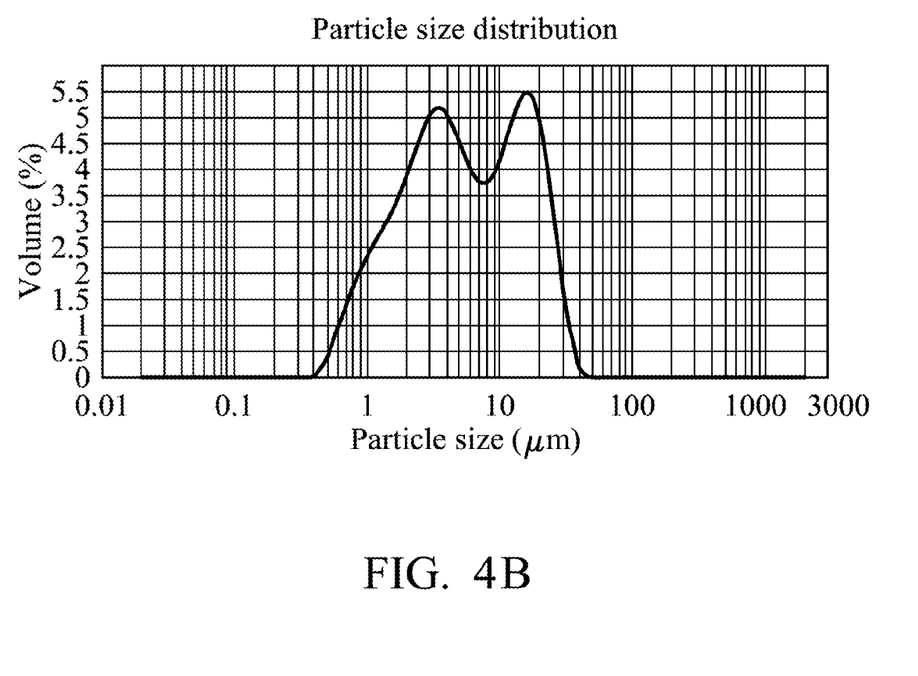
FIG. 4B shows a particle size distribution of the aggregates of the raspberry-like particles according to Preparative Example 1.

In Preparation Example 1, the raspberry-like particles were formed by using ethanol/toluene at a weight ratio of 9/1. The raspberry-like particles were stably dispersed and had a particle size distribution between 0.4-8 μm and an average central particle size of about 2.051 μm. The SEM picture and the particle size distribution of the raspberry-like particles are shown in FIG. 3A and FIG. 3B, respectively. The SEM picture cross-sectional view of the raspberry-like particles is shown in FIG. 3C. As shown in FIG. 3C, the raspberry-like particles have a void-free solid homogeneous cross-section. FIG. 4A and FIG. 4B show the SEM picture and the particle size distribution of the aggregates of the raspberry-like particles of Preparation Example 1.

In Preparation Examples 2 and 3, the raspberry-like particles were formed by using ethanol/toluene in a weight ratio of 8/2 and 7/3, respectively. The raspberry-like particles had a particle size distribution between 0.3-40 μm. Most of the raspberry-like particles were stably dispersed while a part of the particles were aggregated. In Preparation Example 4, the raspberry-like particles were formed by using ethanol/toluene in a weight ratio of 5/5 and lump precipitates were formed. From the above, it appears that the dispersion stability of the raspberry-like particles became worse and the uniformly dispersed primary particles turned to an aggregate form as the weight ratio of toluene became higher in the solvent system. No uniformly dispersed or stable raspberry-like particles were formed when the weight ratio of toluene reached 50%.

In Preparation Example 5, the raspberry-like particles were formed by using ethanol/toluene in a weight ratio of 1/0. The raspberry-like particles were stably dispersed and had a particle, size distribution between 0.4-3 μm.

Examples 1-8

3M fluorinated surfactant (FC4432), toluene, and isopropanol (IPA) with raspberry-like particles of Preparation Examples 1 and 2 were stirred and dispersed, then a thermo-curable acrylic modified resin was added and stirred. The thermo-curable acrylic modified resin was formed by solvent polymerization, wherein 30 wt % of lauryl acrylate monomer and 70 wt % of methyl methacrylate monomer, and 0.3 wt % of benzoyl peroxide (BPO) initiator in toluene solvent were heated to 90° C. for 10 hours. The refraction index of the thermo-curable acrylic modified resin was 1.48. The weight ratio of resin/toluene/isopropanol was 4/9/2. The weight ratio of the surfactant (FC4432)/total particles was 0.042. The raspberry-like particles of Preparation Examples 1 (hereafter "Raspberry-like particles 1") were used as scattering particles in Examples 1-4, wherein the weight ratio of the total particles to the resin was 0.83, 1, 1.2, and 1.5, respectively. The raspberry-like particles of Preparation Examples 2 (hereafter "Raspberry-like particles 2") were used as scattering particles in Examples 5-8, wherein the weight ratio of the total particles to the resin was 0.83, 1, 1.2, and 1.5, respectively. FC4432 was used as a dispersant. The weight ratio of FC4322 to the resin was 0.042.

Each of the uniform dispersions mentioned above was coated on the polyethylene terephthalate (PET) substrate (a thickness of 188 μm; from Toyobo) by wet coating and dried at 100° C. for several minutes to remove solvent to produce a light-extraction element.

Comparative Examples 1-5

The same procedure described in Examples 1-8 was repeated, except that Raspberry-like particles 1 and 2 were replaced with commercial styrene solid round particles (SE-JISUI CHEMICAL), which had a particle distribution between about 1-7 μm and an average central particle size of 3.25 μm.

The optical properties of light-extraction elements formed in the Examples and Comparative Examples are summarized in Table 2. The light-extraction efficiency of light-extraction elements was determined as follows.

Measurement of the Light-Extraction Efficiency

Each of the light-extraction elements was adhered on the light-emitting surface of the commercially available Konica Minolta Symfos OLED light-emitting element by Amctape optical adhesive (OTA-050 propylene adhesive, the thickness was 50 μm, the refractive index was 1.478) to compare their light-extraction efficiencies. A pure OLED device without a light-extraction element was taken as a Comparative Example. The brightness gain value and the change of the chromaticity within a viewing angle of 0-60° of the light-emitting element adhered with a light-extraction element were measured and calculated by a luminance meter (Topcon BM-7).

The particle composition of different light-diffusion layers and optical properties of the overall OLED elements are shown in Table 1 and Table 2. In Table 1 and Table 2, the larger overall light-extraction efficiency the better, and the minor change of Chromaticity (Δu'v') the better. The "Konica" recited in Comparative Example 5 in Table 1 and Table 2 refers to the commercially available Konica Minolta Symfos OLED light-emitting element.

Figure 5A:
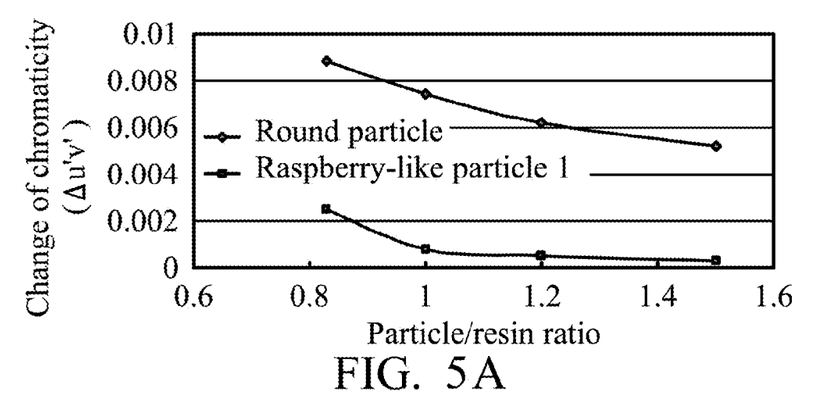
FIG. 5A shows the change of chromaticity of the light-extraction elements having round particles and raspberry-like particles 1 respectively as the particle ratio increases.

FIG. 5A shows the change of chromaticity of the light-extraction elements having round particles and raspberry-like particles 1 respectively as the particles/resin ratio increases. As shown in Comparative Examples 1-4 and Examples 1-4 of Table 2, comparing the change of chromaticity of the light-extraction elements respectively having round particles and raspberry-like particles 1 at the same ratio of particles/resin, the change of chromaticity of the light-extraction elements having raspberry-like particles 1 significantly decreases. When the ratio of raspberry-like particles/resin reached 1, the changes of chromaticity were all less than 0.0008, preferably 0.0003.

Figure 5B:
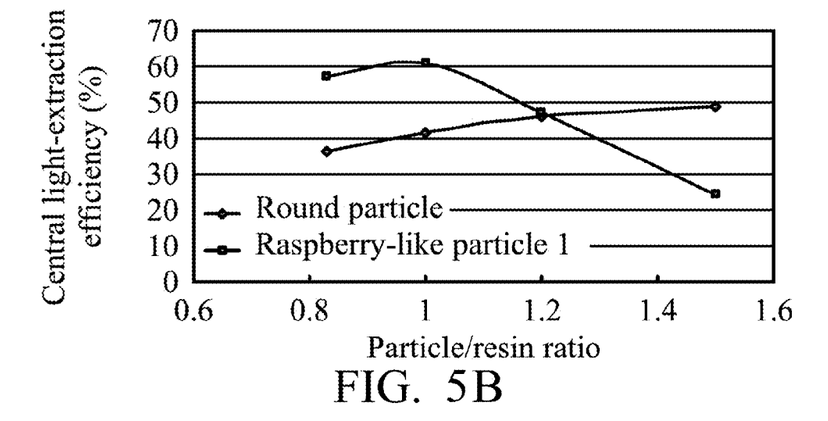
FIG. 5B slows the central light-extraction efficiency of the light-extraction elements having round particles and raspberry-like particles 1 respectively as the particle ratio increases.

FIG. 5B slows the central light-extraction efficiency of the light-extraction elements having round particles and raspberry-like particles 1 respectively as the particles/resin ratio increases. As shown in Comparative Examples 1-4 and Examples 1-4 of Table 2, when the ratio of particles/resin was 0.83, 1, and 1.2, respectively, the central light-extraction efficiency of light-extraction elements having raspberry-like particles was greater than that of light-extraction elements having round particles.

Figure 5C:
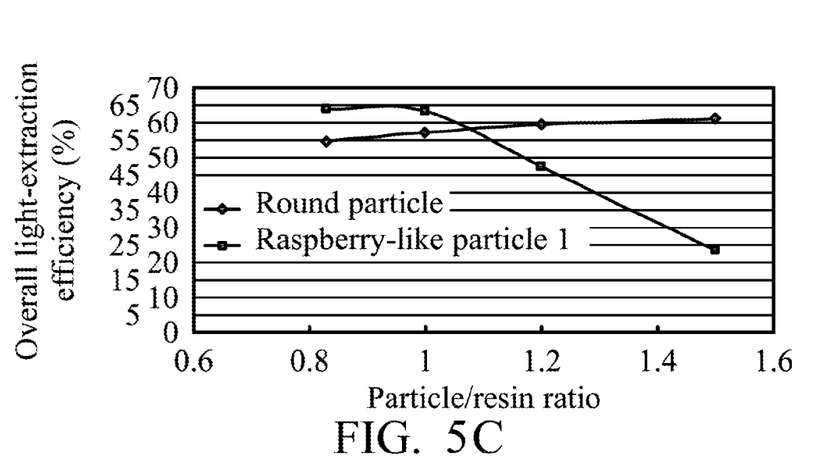
FIG. 5C shows the overall light-extraction efficiency of the light-extraction elements respectively having round particles and raspberry-like particles 1 as the particle ratio increases.

FIG. 5C shows the overall light-extraction efficiency of the light-extraction elements having round particles and raspberry-like particles 1 respectively as the particles/resin ratio increases. As shown in Comparative Examples 1-4 and Examples 1-4 of Table 2, when the ratio of particles/resin was 0.83, 1, and 1.2, respectively, the overall light-extraction efficiency of light-extraction elements having raspberry-like particles was greater than that of light-extraction elements having round particles.

Figure 6A:
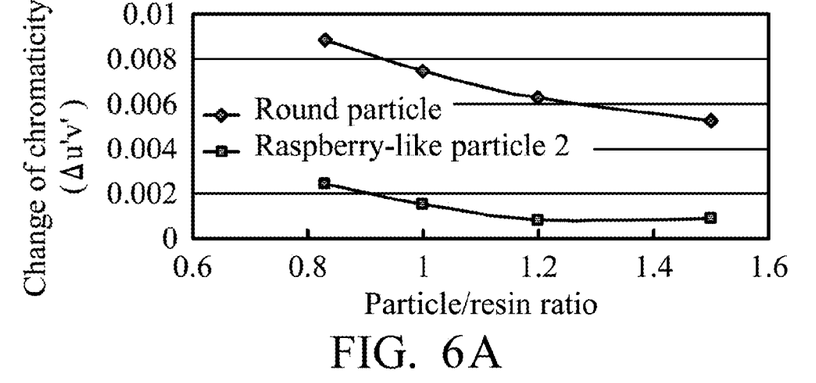
FIG. 6A shows the change of chromaticity of the light-extraction elements having round particles and raspberry-like particles 2 respectively as the particle ratio increases.

FIG. 6A shows the color change of the light-extraction elements having round particles and raspberry-like particles 2 respectively as the particles/resin ratio increases. As shown in Comparative Examples 1-4 and Examples 5-8 of Table 2, comparing the change of chromaticity of the light-extraction elements respectively having round particles and raspberry-like particles 1 under the same ratio of particles/resin, the change of chromaticity of the light-extraction elements having raspberry-like particles 1 significantly decreases. When the ratio of raspberry-like particles/resin reached 1, the changes of chromaticity were all less than 0.0015, preferably 0.0008.

Figure 6B:
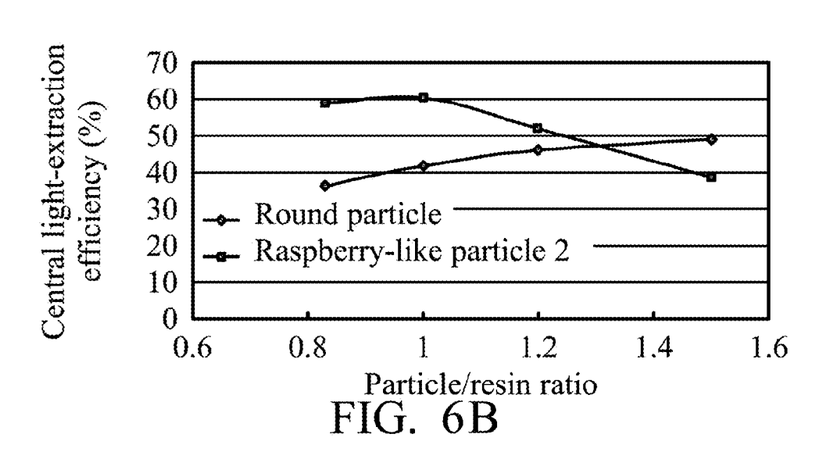
FIG. 6B shows the central light-extraction efficiency of the light-extraction elements having round particles and raspberry-like particles 2 respectively as the particle ratio increases.

FIG. 6B slows the central light-extraction efficiency of the light-extraction elements having round particles and raspberry-like particles 2 respectively as the particles/resin ratio increases. As shown in Comparative Examples 1-4 and Examples 5-8 of Table 2, when the ratio of particles/resin was 0.83 and 1, respectively, the central light-extraction efficiency of light-extraction elements having raspberry-like particles was greater than that of light-extraction elements having round particles.

Figure 6C:
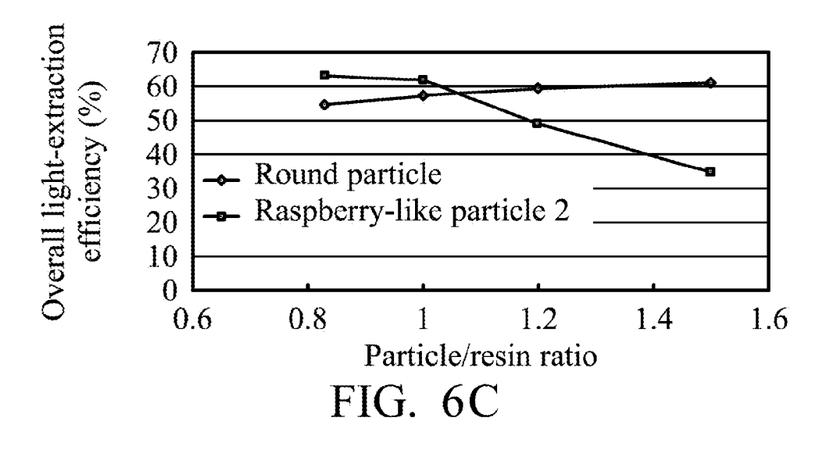
FIG. 6C shows the overall light-extraction efficiency of the light-extraction elements having round particles and raspberry-like particles 2 respectively as the particle ratio increases.

FIG. 6C shows the overall light-extraction efficiency of the light-extraction elements having round particles and raspberry-like particles 2 respectively as the particles/resin ratio increases. As shown in Comparative Examples 1-4 and Examples 5-8 of Table 2, when the ratio of particles/resin was 0.83 and 1, respectively, the overall light-extraction efficiency of light-extraction elements having raspberry-like particles was greater than that of light-extraction elements having round particles.

As shown above, no matter which raspberry-like particles 1 or 2 are used as scattering particles of the light-diffusion layer, not only are the central and overall light-extraction efficiency higher but also the change of chromaticity becomes smaller than using round particles, indicating that the raspberry-like particles 1 or 2 have better efficiency at decreasing color shift.

TABLE 2

| Examples | Particle type | Particles/resin (wt %) | Bump number per particle surface | Change of chromaticity (Δu'v') | Central light-extraction efficiency (%) | Overall light-extraction efficiency (%) |
|---|---|---|---|---|---|---|
| Comparative Example 1 | Round particles | 0.83 | 0 | 0.0088 | 36.38 | 54.6 |
| Comparative Example 2 | Round particles | 1 | 0 | 0.0074 | 41.79 | 57.21 |
| Comparative Example 3 | Round particles | 1.2 | 0 | 0.0062 | 46.1 | 59.47 |
| Comparative Example 4 | Round particles | 1.5 | 0 | 0.0052 | 49.02 | 60.92 |
| Comparative Example 5 | — | — | — | 0.0211 | 0 | 0 |
| Example 1 | Raspberry-like particles 1 | 0.83 | >10 | 0.0025 | 57.12 | 63.85 |
| Example 2 | Raspberry-like particles 1 | 1 | >10 | 0.0008 | 60.77 | 63.41 |
| Example 3 | Raspberry-like particles 1 | 1.2 | >10 | 0.0005 | 47.23 | 47.51 |
| Example 4 | Raspberry-like particles 1 | 1.5 | >10 | 0.0003 | 24.35 | 23.47 |
| Example 5 | Raspberry-like particles 2 | 0.83 | >10 | 0.0024 | 58.75 | 63.13 |
| Example 6 | Raspberry-like particles 2 | 1 | >10 | 0.0015 | 60.17 | 61.65 |

TABLE 2-continued

| Examples | Particle type | Particles/resin (wt %) | Bump number per particle surface | Change of chromaticity (Δu'v') | Central light-extraction efficiency (%) | Overall light-extraction efficiency (%) |
|---|---|---|---|---|---|---|
| Example 7 | Raspberry-like particles 2 | 1.2 | >10 | 0.0008 | 51.93 | 49.04 |
| Example 8 | Raspberry-like particles 2 | 1.5 | >10 | 0.0009 | 38.56 | 34.81 |

It will be apparent to those skilled in the art that various modifications and variations can be made to the disclosed embodiments. It is intended that the specification and examples be considered as exemplary only, with true a true scope of the disclosure being indicated by the following claims and their equivalents.

What is claimed is:

1. A light-extraction element, comprising:
 a light-diffusion layer, the light-diffusion layer comprising:
 a resin; and
 a plurality of raspberry-like particles uniformly dispersed in the resin, wherein the raspberry-like particles feature a surface contour with a plurality of round bumps, and the plurality of raspberry-like particles are composed of a material having a single reflective index, wherein the plurality of raspberry-like particles per se are primary particles and has a homogeneous cross-section, wherein the homogeneous cross-section has no interface, wherein the raspberry-like particles are used as diffusion materials in the light-extraction element and the scattering caused by the surface contour of the raspberry-like particles enhances the light-extraction efficiency and reduces the color shift.

2. The light-extraction element as claimed in claim 1, wherein the light-diffusion layer further comprises an aggregate form of the plurality of raspberry-like particles.

3. The light-extraction element as claimed in claim 1, wherein each of the plurality of raspberry-like particles has a particle size between 0.01 μM and 50 μm.

4. The light-extraction element as claimed in claim 1, wherein each of the plurality of raspberry-like particles has a particle size between 0.3 μm and 40 μm.

5. The light-extraction element as claimed in claim 1, wherein the ratio of the weight of the plurality of raspberry-like particles to the weight of the resin is between 1/10 and 10/1.

6. The light-extraction element as claimed in claim 1, wherein the resin comprises a thermoplastic resin, a thermo-curable resin, a light-curable resin, or combinations thereof.

7. The light-extraction element as claimed in claim 1, wherein the plurality of raspberry-like particles are formed of an organic material, comprising polystyrene, polymethyl methacrylate, polydivinylbenzene, polyethylene glycol dimethacrylate, polytrimethylolpropane trimethacrylate, or copolymers thereof, polycarbonate, polyethylene, or combinations thereof.

8. The light-extraction element as claimed in claim 1, wherein the plurality of raspberry-like particles are formed of an inorganic material, comprising silicone resin, calcium carbonate, silicon dioxide, titanium dioxide, or combinations thereof.

9. The light-extraction element as claimed in claim 1, wherein the resin covers the plurality of raspberry-like particles and forms a flat top surface.

10. The light-extraction element as claimed in claim 1, wherein the resin covers the plurality of raspberry-like particles and forms an irregular top surface.

11. The light-extraction element as claimed in claim 1, further comprising a substrate, and the light-diffusion layer is disposed on the substrate.

12. The light-extraction element as claimed in claim 11, further comprising an adhesive layer which is disposed on an opposite surface of the substrate relative to the light-diffusion layer.

13. The light-extraction element as claimed in claim 12, wherein the adhesive layer comprises a transparent glue including polypropylene, a thermo-curable glue, or an ultraviolet light-curable glue.

14. The light-extraction element as claimed in claim 13, further comprising an additive including at least one non-ionic dispersant, at least one surfactant, or combinations thereof.

15. The light-extraction element as claimed in claim 14, wherein the ratio of the additive is 0.005-15 wt % based on the weight of the plurality of raspberry-like particles.

16. The light-extraction element as claimed in claim 14, wherein the ratio of the additive is 0.1-10 wt % based on the weight of the plurality of raspberry-like particles.

17. A light-emitting device, comprising:
 a pair of electrodes composed of an anode and a cathode;
 an organic light-emitting unit disposed between the pair of electrodes, wherein the organic light-emitting unit comprises a light-emitting layer; and
 a light-extraction element as claimed in claim 1, which is disposed on a light-emitting surface of the light-emitting device.

18. The light-emitting device as claimed in claim 17, wherein the organic light-emitting unit further comprises:
 a hole injection layer disposed on the anode;
 a hole transport layer disposed on the hole injection layer;
 an electron transport layer disposed on the hole transport layer; and
 an electron injection layer disposed on the electron transport layer and under the cathode.

* * * * *